(12) United States Patent
Wimplinger et al.

(10) Patent No.: US 9,358,765 B2
(45) Date of Patent: Jun. 7, 2016

(54) METHOD FOR COATING AND BONDING SUBSTRATES

(71) Applicant: EV GROUP E. THALLNER GMBH, St. Florian am Inn (AT)

(72) Inventors: Markus Wimplinger, Ried im Innkreis (AT); Bernhard Rebhan, Haag a. H. (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 14/429,960

(22) PCT Filed: Sep. 28, 2012

(86) PCT No.: PCT/EP2012/069268
§ 371 (c)(1),
(2) Date: Mar. 20, 2015

(87) PCT Pub. No.: WO2014/048502
PCT Pub. Date: Apr. 3, 2014

(65) Prior Publication Data
US 2015/0224755 A1    Aug. 13, 2015

(51) Int. Cl.
*B23K 20/00*     (2006.01)
*H01L 23/00*     (2006.01)
(Continued)

(52) U.S. Cl.
CPC ............... *B32B 37/16* (2013.01); *B23K 20/02* (2013.01); *B23K 20/023* (2013.01); *B23K 20/026* (2013.01); *B23K 20/16* (2013.01); *B23K 20/24* (2013.01); *B32B 37/10* (2013.01); *B32B 37/12* (2013.01); *B32B 38/0036* (2013.01); *C23C 14/24* (2013.01); *C23C 16/44* (2013.01); *C23C 28/02* (2013.01); *C25D 5/00* (2013.01); *H01L 24/27* (2013.01); *H01L 24/29* (2013.01); *H01L 24/83* (2013.01); *B32B 2309/025* (2013.01);
(Continued)

(58) Field of Classification Search
CPC .... B23K 20/02; B23K 20/023; B23K 20/026; B23K 20/24; B23K 35/001; H01L 24/27–24/30; H01L 24/83
See application file for complete search history.

(56) References Cited

U.S. PATENT DOCUMENTS 4,077,558 A * 3/1978 Carlson et al. ................. 228/121
2007/0037337 A1 * 2/2007 Takahashi et al. ............. 438/197

FOREIGN PATENT DOCUMENTS

DE    102005058654 A1    6/2007    ............. H01L 21/60

OTHER PUBLICATIONS

International Search Report issued in corresponding International Application No. PCT/EP2012/069268, dated Jun. 4, 2013.

*Primary Examiner* — Carson Gross
(74) *Attorney, Agent, or Firm* — Kusner & Jaffe

(57) ABSTRACT

A method for coating of a first substrate with a first diffusion bond layer by deposition of a first material which forms the first diffusion bond layer on a first surface of the first substrate such that the first diffusion bond layer forms a grain surface with an average grain diameter H parallel to the first surface smaller than 1 μm. The invention further relates to a method for bonding of a first substrate which has been coated as described above to a second substrate which has a second diffusion bond layer, the method of the bonding comprising the following steps: bring a first diffusion bond layer of a first substrate into contact with a second diffusion bond layer of a second substrate, pressing the substrates together to form a permanent metal diffusion bond between the first and second substrates.

18 Claims, 2 Drawing Sheets

(51) Int. Cl.
*B32B 37/16* (2006.01)
*B23K 20/02* (2006.01)
*B23K 20/16* (2006.01)
*B23K 20/24* (2006.01)
*B32B 37/10* (2006.01)
*B32B 37/12* (2006.01)
*B32B 38/00* (2006.01)
*C23C 14/24* (2006.01)
*C23C 16/44* (2006.01)
*C23C 28/02* (2006.01)
*C25D 5/00* (2006.01)

(52) U.S. Cl.
CPC .......... *B32B 2309/12* (2013.01); *B32B 2311/12* (2013.01); *H01L 2224/2745* (2013.01); *H01L 2224/27452* (2013.01); *H01L 2224/27462* (2013.01); *H01L 2224/27464* (2013.01); *H01L 2224/29082* (2013.01); *H01L 2224/29083* (2013.01); *H01L 2224/29147* (2013.01); *H01L 2224/29166* (2013.01); *H01L 2224/29181* (2013.01); *H01L 2224/29644* (2013.01); *H01L 2224/29647* (2013.01); *H01L 2224/29664* (2013.01); *H01L 2224/29666* (2013.01); *H01L 2224/29684* (2013.01); *H01L 2224/8309* (2013.01); *H01L 2224/83013* (2013.01); *H01L 2224/83065* (2013.01); *H01L 2224/83075* (2013.01); *H01L 2224/8382* (2013.01); *H01L 2224/83097* (2013.01); *H01L 2224/83099* (2013.01); *H01L 2224/83193* (2013.01); *H01L 2224/83203* (2013.01); *H01L 2924/10253* (2013.01); *H01L 2924/351* (2013.01); *Y10T 156/10* (2015.01)

METHOD FOR COATING AND BONDING SUBSTRATES

RELATED APPLICATIONS

This application is a National Stage of International Application No. PCT/EP2012/069268 filed Sep. 28, 2012.

FIELD OF THE INVENTION

This invention relates to a method for coating of a first substrate with a first diffusion bond layer and to a method of bonding.

BACKGROUND OF THE INVENTION

The objective in permanent or irreversible bonding of substrates is to produce a connection as strong and as permanent as possible, i.e., a high bond force, between the two contact surfaces of the substrates. For this purpose, in the prior art there are various approaches and production methods, such as the welding of the surfaces at higher temperatures.

All types of materials, predominantly metals, semimetals, semiconductors, polymers and/or ceramics, are permanently bonded. One of the most important systems of permanent bonding is metal-metal systems. Cu—Cu systems have appeared increasingly in recent years. The development of 3D structures requires the joining of different functional layers. This joining is more and more often accomplished by way of so-called TSVs (through silicon vias). The contact-making of these TSVs with one another very often takes place by copper contact sites. At the instant of bonding, there are very often full-value, serviceable structures, for example microchips, on one or more surfaces of the substrates. Since different materials with different coefficients of thermal expansion are used in microchips, increasing the temperature during bonding is not desirable. This can lead to thermal expansions and thus to thermal stresses and/or stress induced voiding (SIV) which can destroy parts of the microchip or its vicinity.

The known production methods and the approaches which have been followed to date often lead to results which cannot be reproduced (or can only be poorly reproduced) and which can hardly be applied to altered conditions. In particular, production methods which are used at present often use high temperatures, especially >400° C., in order to ensure reproducible results.

Technical problems such as high energy consumption and a possible destruction of structures which are present on the substrates result from the high temperatures which have been necessary to date for a high bond force and the rapid and/or often completed temperature changes which arise due to loading and/or unloading, of in part far above 300° C.

Other demands consist in the following:
back-end-of-line compatibility.

This is defined as the compatibility of the process during the processing. The bonding process must therefore be designed such that back-end-of-line structures, generally consisting of electrical conductors and low-k dielectrics which are already present on the structure wafers, are neither adversely affected nor damaged during the processing. Compatibility criteria include mechanical and thermal loadability, mainly by thermal stresses and stress induced voiding (SIV).
front-end-of-line compatibility.

This is defined as the compatibility of the process during the production of the electrically active components. The bonding process must therefore be designed such that active components such as transistors which are already present on the structure wafers, are neither adversely affected nor damaged during the processing. Compatibility criteria include the purity of certain chemical elements (mainly in CMOS structures), mechanical and thermal loadability, mainly by thermal stresses.
low contamination.
no application of force, or application of force as low as possible.
temperature as low as possible, especially for materials with different coefficients of thermal expansion.

The reduction of the bond force leads to more careful treatment of the structure wafer and thus to a reduction of the failure probability by direct mechanical loading, especially when the insulating layers between the metallic conductors are made from so-called "low-k" materials.

Current bonding methods are designed primarily for high pressures and temperatures. Avoiding a high temperature is of essential importance for the welding of future semiconductor applications, since different materials with different coefficients of thermal expansion generate thermal stresses which cannot be ignored during heating and cooling processes. Furthermore, the diffusion of doping elements as the temperature rises is increasingly becoming a problem. The doped elements should not leave the intended three-dimensional region after the doping process. Otherwise, the physical properties of the circuits would fundamentally change. In the best case, this leads to deterioration, in the worst and most probable case to unserviceability of the component. Memories are very susceptible due to degradation of the dielectric and the associated shortened storage time during thermal processes. On the other hand, there are memories in which 3D technology is being increasingly used to raise the capacity and performance.

An advantage of this invention is a method for production of a permanent bond between two substrates with a bond force as high as possible at a temperature which is simultaneously as low as possible and/or at an average process time.

This advantage is achieved with the features of claims 1 and 6. Advantageous developments of the invention are given in the dependent claims. All combinations of at least two of the features given in the specification, the claims and/or the figures also fall within the framework of the invention. At the given value ranges, values which lie within the indicated boundaries will also be considered disclosed as boundary values and will be claimed in any combination.

SUMMARY OF THE INVENTION

The basic concept of this invention is to apply or create at least on one of the substrates a diffusion bond layer of a material which has a microstructure with a grain as fine as possible, and thus a grain boundary surface as large as possible. As claimed in the invention, grain boundaries are preferred which run normally to the substrate surfaces which are to be bonded. This is achieved by controlled setting of the layer thickness of the diffusion bond layer which constitutes a limiting criterion for the grain size. The two substrates can, but need not necessarily, prebond with one another. Simple contact-making without formation of a prebond is also possible. As used herein, the term "reaction" should be understood as solid diffusion. Before and/or after formation/application of the diffusion bond layer(s) on the first and/or second substrate, cleaning of the substrate or of the substrates generally takes place by a rinsing step. This cleaning should generally ensure that there are no particles on the surfaces which would result in unbonded sites. Ideally all steps of deposition and/or bonding take place in a closed system which is preferably flooded with inert gas, more preferably evacuated so that a cleaning step after coating can be omitted.

According to the present invention, a diffusion bond layer is formed on the contact surface between the first and second substrate, the diffusion bond layer having an average grain diameter H parallel to the contact surface or substrate surface smaller than 1 µm.

The diffusion bond layer which is formed in this way and which has a small average grain diameter creates the technical possibility of causing faster diffusion directly on the contact surfaces between the substrates and thus enabling the permanent bond at low temperatures and furthermore strengthening it, and increasing the bond speed.

Hereinafter deformation is defined as a change of the surface and/or of the bulk as a result of diffusion.

All elements of the periodic table, mainly the metals, semimetals, lanthanoids and actinoids are possible as materials for the diffusion bond layer.

The invention however is preferably used for Cu—Cu bonds.

The following mixed forms of semiconductors are conceivable as substrates:
III-V: GaP, GaAs, InP, InSb, InAs, GaSb, GaN, AlN, InN, $Al_xGa_{1-x}As$, $In_xGa_{1-x}N$
IV-IV: SiC, SiGe,
III-VI: InAlP,
nonlinear optics: $LiNbO_3$, $LiTaO_3$, KDP ($KH_2PO_4$)
solar cells: CdS, CdSe, CdTe, $CuInSe_2$, $CuInGaSe_2$, $CuInS_2$, $CuInGaS_2$
conductive oxides: $In_{2-x}SnxO_{3-y}$ It is especially advantageous if contact-making of the substrates after application of the diffusion bond layer takes place as near as possible in time, especially within 2 hours, preferably within 30 minutes, even more preferably within 10 minutes, ideally within 5 minutes. This measure minimizes possible unwanted reactions such as oxidation of the metal diffusion bond layer or of the surfaces of the substrates.

Oxide removal before the actual bonding process is also possible. The oxide can be removed for example by wet-chemical means or with corresponding reducing gases. Any known chemical and/or physical methods for oxide reduction can be used.

As claimed in the invention, there can be means for inhibiting these reactions of the metal diffusion bond layer and/or of the surfaces of the substrates before the contact surfaces make contact, by passivation of the surfaces of the substrates, preferably by exposure to $N_2$, forming gas or an inert atmosphere or under a vacuum or by amorphization. In this respect, treatment with plasma which contains forming gas, i.e., comprised largely of forming gas, has proven suitable. Here, forming gas is defined as gases which contain at least 2%, better 4%, ideally 10% or 15% hydrogen. The remaining portion of the mixture is comprised of an inert gas such as for example nitrogen or argon. Systems with an inert atmosphere or vacuum atmosphere can preferably be implemented as systems in which the transfer of the substrates from one process chamber to the next process chamber takes place by means of a substrate handling system which can carry out the transfer of the substrates completely in a controlled, adjustable atmosphere, namely, a vacuum atmosphere. These systems are known to one skilled in the art.

The diffusion bond layer is applied by one or more of the following methods:
CVD especially PECVD, LPCVD, MOCVD or ALD
PVD especially sputtering or vapor deposition
epitaxy especially MBE, ALE
electrochemical deposition processes
currentless deposition processes The invention thus solves the problem of better welding of the surfaces of two coated substrates which have been brought into contact with one another by using the microstructure properties of the uppermost layer, the diffusion bond layer. The invention thus relates to a method and a process for adjusting the microstructure of the uppermost deposited layer by the controlled deposition of thin layers by means of chemical and/or physical processes such that its grain interface is as large as possible. Preferably, the grain boundaries run normally to the substrate surface.

The grain size which is small yields an extremely increased grain boundary surface and thus accordingly larger diffusion paths; this promotes the welding of the two material layers during bonding. The concept of the invention therefore is comprised in increasing the flow of those atoms which diffuse along the grain boundaries by increasing the grain boundary surface.

According to another advantageous embodiment of the invention, it is provided that the formation of the permanent bond takes place at a temperature between room temperature and 400° C., especially between room temperature and 300° C., preferably between room temperature and 200° C., even more preferably between room temperature and 100° C., and takes place especially during a maximum 12 days, preferably a maximum 1 day, even more preferably a maximum 1 hour, best a maximum 15 minutes.

Here, it is especially advantageous if the irreversible bond has a bond strength of greater than 1.5 $J/m^2$, especially greater than 2 $J/m^2$, preferably greater than 2.5 $J/m^2$. The bond strength can be determined for example with the so-called Maszara test.

The bond strength can be increased advantageously in that the two substrates have a diffusion bond layer with a grain size which is very small and thus a very large grain boundary surface. This enables increased diffusion flow in both directions which accordingly supports the bond process.

Prior to application/formation of the function layer plasma, if activation of the surfaces of the substrates takes place with an activation frequency between 10 and 600 kHz and/or a power density between 0.075 and 0.2 watt/$cm^2$ and/or with application of a pressure between 0.1 and 0.6 mbar, additional effects such a smoothing of the contact surface are caused. Here application of pressure is defined as the pressure of the working atmosphere during plasma activation.

If the substrates are pressed together at a pressure between 0.1 MPa and 10 MPa, optimum results can be achieved. Preferably, the pressure is between 0.1 and 10 MPa, still more preferably between 0.1 and 1 MPa, most preferably between 0.1 and 0.3 MPa. The pressure must be chosen to be greater, the larger the irregularities and the thinner the layers.

According to one embodiment of the invention, the formation/application of the diffusion bond layer is carried out in a vacuum. Thus, the contamination of the diffusion bond layer with unwanted materials or compounds can be avoided.

It is especially effective for the sequence of the method if the diffusion bond layer is made preferably in an average thickness R between 0.1 nm and 2500 nm, more preferably between 0.1 nm and 150 nm, even more preferably between 0.1 nm and 10 nm, most preferably between 0.1 nm and 5 nm.

Other advantages, features and details of the invention will become apparent from the following description of preferred exemplary embodiments and using the drawings.

DETAILED DESCRIPTION OF THE PREFERRED EMBODIMENTS

Figure 1:
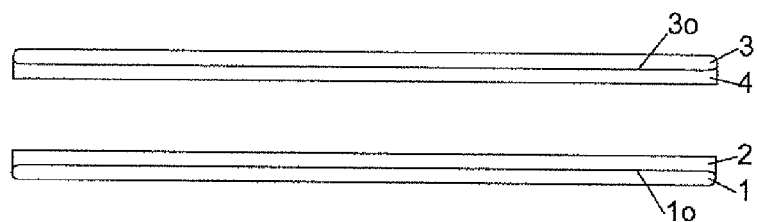
FIG. 1 shows a cross section of two substrates which have been coated as claimed in the invention with a layer system.

In the drawings and in the following description, the same or equivalent features are identified with the same reference numbers. The drawings are not to scale. Mainly, the intermediate layers and diffusion bond layer are shown several times larger to be able to better represent the microstructure.

The invention relates to a method for bonding of two coated substrates 1, 3 to one another via two layer systems 2, 4. The layer systems 2, 4 can be composed of any number of layers 5, 5', 5" of different type (intermediate layers 5', 5" and diffusion bond layer 5) with different physical and/or chemical properties and microstructures. The layer which is uppermost at the time (contact surface between the layer systems 2, 4) is a diffusion bond layer 5, therefore a layer whose grain size is limited.

The diffusion bond layer 5 which is applied to the first surface 1o of the first substrate 1 is called the first diffusion bond layer and the one applied to a second surface 3o of the second substrate 3 is called the second diffusion bond layer.

The average grain diameter H of the diffusion bond layer 5 on the surface 1o, 3o, of the substrates 1, 3, which diameter is projected parallel to the surface (plan view), is preferably less than 1 µm, more preferably less than 100 nm, still more preferably less than 10 nm, even more preferably less than 5 nm, most preferably less than 1 nm.

The average grain diameter V of the diffusion bond layer 5 on the surface 1o, 3o, of the substrates 1, 3, which is measured orthogonally to the average grain diameter H or to the substrate surface is preferably less than 1 µm, more preferably less than 100 nm, still more preferably less than 10 nm, even more preferably less than 5 nm, most preferably less than 1 nm.

Figure 2:
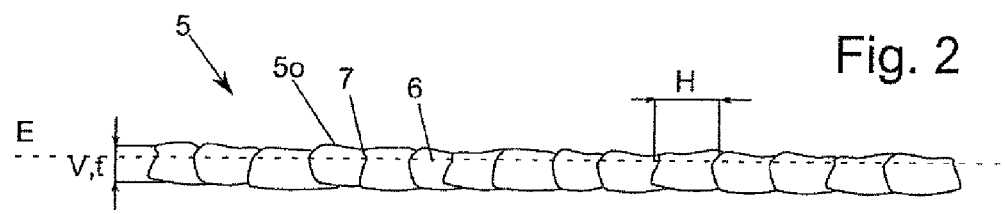
FIG. 2 shows a diffusion bond layer as claimed in the invention.

The projected grain diameters H and V are not necessarily the same. But for very thin layer thickness t, H and V are presumably of the same order of magnitude. In this case, V or t limits the grain diameter. This is due to the surface energy E which prevents enlargement of the grain. In the embodiment as shown in FIG. 2, the vertical grain diameter V is stipulated as limiting by a layer thickness t of the layer system 2 comprised of only a single diffusion bond layer 5. Then, a layer thickness t of the layer system 2 is equal to the grain diameter V.

Figure 4:
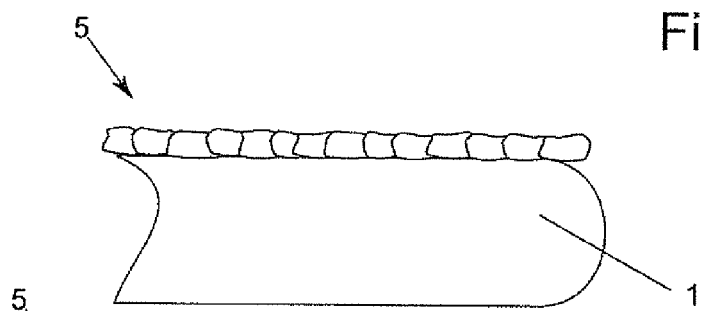
FIG. 4 shows a diffusion bond layer applied to a substrate.

In the embodiment shown in FIG. 4, the diffusion bond layer 5 with a grain interface as large as possible is deposited directly on the first substrate 1.

Figure 5:
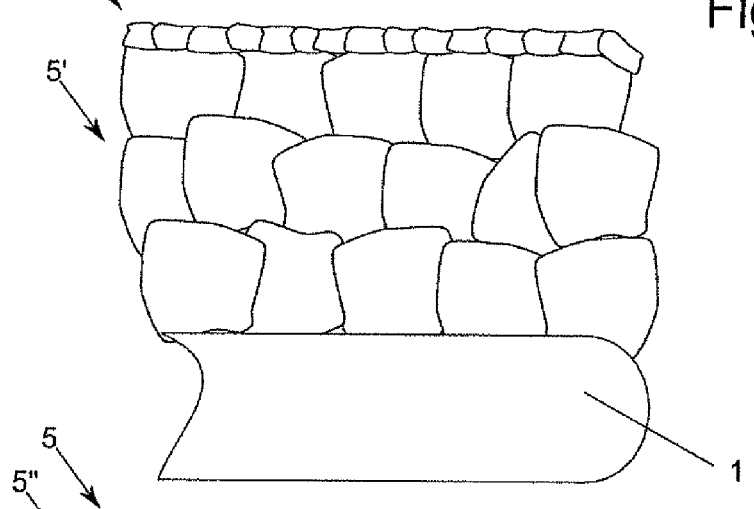
FIG. 5 shows a layer system applied to a substrate with one intermediate layer and one diffusion bond layer and FIG. 6 shows a layer system applied to a substrate with two intermediate layers and one diffusion bond layer.

In another embodiment of the invention as shown in FIG. 5, the diffusion bond layer 5 with a grain interface as large as possible (therefore with many grain boundaries) is deposited on any other intermediate layer 5'. The intermediate layer 5' can be the same material with optionally different distribution of the grain size as in the diffusion bond layer 5. The microstructure on the contact surface (surface 5o of the diffusion bond layer 5) was influenced especially exclusively by the deposition process. In particular the intermediate layer 5' was produced by an electrochemical deposition process (ECD) or PVD process, conversely the diffusion bond layer 5 is produced by PVD and/or CVD processes.

Figure 3:
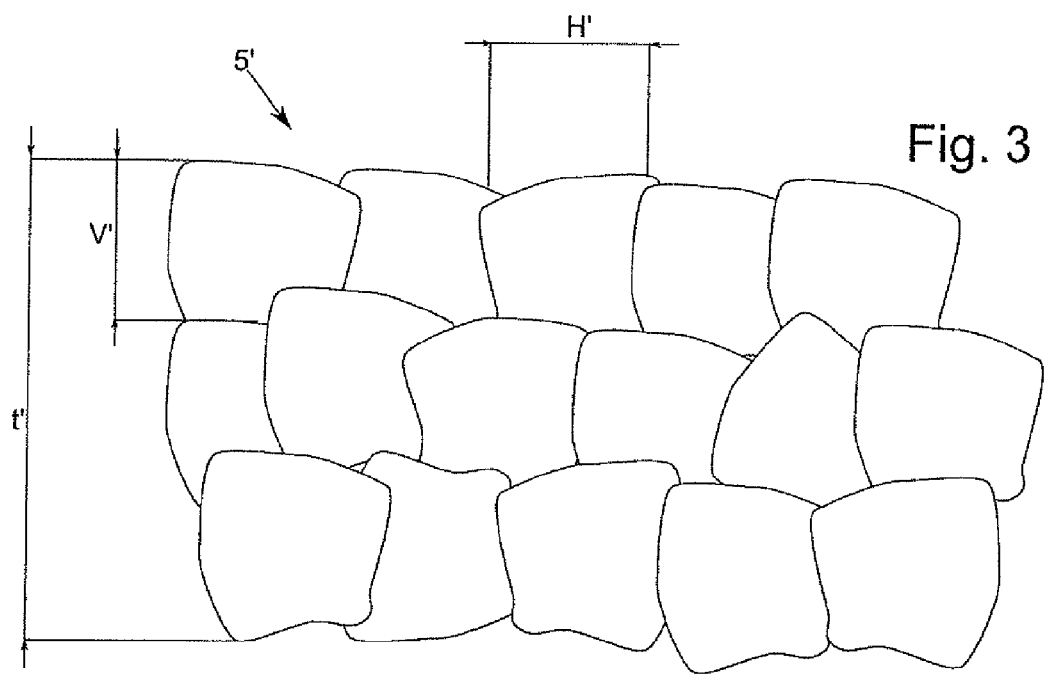
FIG. 3 shows an intermediate layer as claimed in the invention.

The intermediate layer 5' as shown in FIG. 3 has a larger average grain diameter H' parallel to the surface 1o or 3o and a larger average grain diameter V' transversely to the surface 1o or 3o. Here, it is also advantageous if the layer thickness t' of the intermediate layer 5' is larger, especially twice as large, preferably 3 times, more preferably 5 times, still more preferably 10 times, most preferably 100 times, most preferably of all 1000 times as large as the average grain diameter V.

Figure 6:
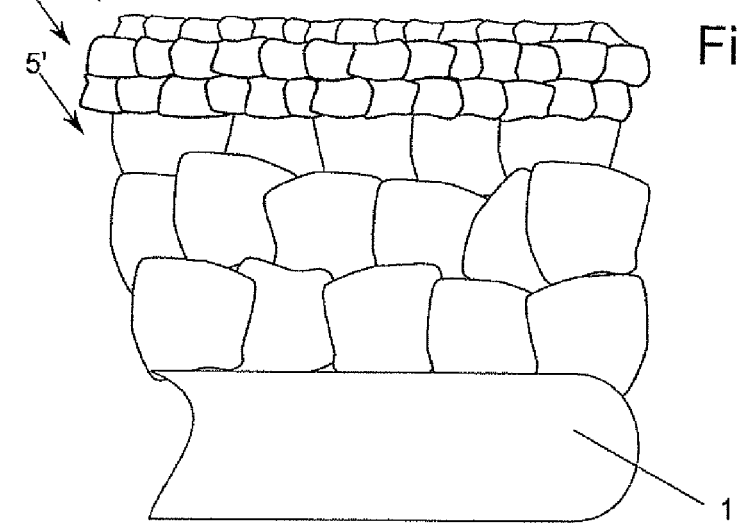

In another embodiment of the invention as shown in FIG. 6, another intermediate layer 5" is deposited between the diffusion bond layer 5 and the intermediate layer 5'. The intermediate layer 5" has the task of preventing a possible interdiffusion between the diffusion bond layer 5 and the intermediate layer 5' so that the microstructure of the diffusion bond layer 5 is preserved up to the actual bond process.

More efficient diffusion of the atoms from the layer system 2 into the layer system 4 and vice versa takes place by a subsequent bond process of the two substrates 1, 3 via their layer systems 2, 4 by the large grain interface (and thus a large number of grain boundaries) of at least one diffusion bond layer.

According to the invention, the diffusion bond layer 5 is the layer which forms the contact surface. The reason is that the diffusion bond layer 5 has a very large number of grain boundaries 7. The average diffusion flow takes place therefore preferably in the vertical direction (transversely to the surface 1o, 3o) along these grain boundaries 7.

The intrinsic diffusion of a species along one free surface is greater than along the grain boundaries, but along the grain boundaries, diffusion is greater than within the bulk. Preferably, the "interdiffusion" of the atoms of the two layer systems 2 and 4 into one another over the grain boundaries will take place by the large number of grain boundaries.

The bonding of the two layer systems 2 and 4 takes place preferably at temperatures as low as possible. For metals the bonding takes place preferably at a homologous temperature of less than 1.0 but above room temperature and below a temperature of 300° C.

Layer systems as claimed in the invention would include the following:
Si substrate/thin diffusion barrier/thick (ECD) Cu layer/thin diffusion bather (for example Ti, Ta, . . . )/thin (PVD) Cu layer
Si substrate/thin diffusion barrier/thick (ECD) Cu layer/thin (PVD) Cu layer
Si substrate/thin diffusion barrier/thin (PVD) Cu layer
Si substrate/thin diffusion barrier/Cu layer/thin Si layer
Si substrate/thin diffusion barrier/Cu layer/thin layer of a transition metal (Ti, Ta, W, . . . )
Si substrate/thin diffusion barrier/Cu layer/thin layer of a precious metal (Au, Pd, . . . )
any combination of the aforementioned layer systems The bond process can take place by the bonding of any of the aforementioned layer systems to any other of the aforementioned layer systems. Analogous considerations apply to any other layer system which is not mentioned explicitly in the text, but which is based on the same inventive idea.

The method which is preferred for producing the intermediate layers 5', 5" with comparatively large grain sizes (compared to the diffusion bond layer 5) is electrochemical deposition (ECD).

The method which is preferred for producing the diffusion bond layer 5 with comparatively small grain sizes are all PVD and/or CVD method.

REFERENCE NUMBER LIST 1 first substrate
1o surface
2 layer system
3 second substrate
3o surface
4 layer system
4o, 4o' surface
5 diffusion bond layer
5', 5" intermediate layers
6 grain
7 grain boundary
t, t' layer thickness
H, H' (average) grain diameter
V, V' (average) grain diameter Having described the invention, the following is claimed:

1. A method of coating a first substrate with a first diffusion bond layer, the method comprising:
forming a first intermediate layer on a first surface of the first substrate, the first intermediate layer having an average grain diameter H' parallel to the first surface and an average grain diameter V' transverse to the first surface; and
depositing the first diffusion bond layer on the first intermediate layer, the first diffusion bond layer being formed of a first material and having an average grain diameter H parallel to the first surface and an average grain diameter V transverse to the first surface, the average grain diameter H being less than 1 µm,
wherein the average grain diameter H' is greater than the average grain diameter H, and
wherein the average grain diameter V' is greater than the average grain diameter V.

2. The method as claimed in claim 1, wherein the average grain diameter V is less than 1 µm.

3. The method as claimed in claim 1, wherein the first diffusion bond layer has an average thickness t transverse to the first surface, the average thickness t being less than 1 µm.

4. The method as claimed in claim 1, wherein the forming of the first intermediate layer comprises electrochemically depositing the first intermediate layer by an electrochemical deposition process.

5. The method as claimed in claim 1, wherein the first diffusion bond layer is deposited by physical gaseous phase deposition and/or chemical gaseous phase deposition.

6. The method as claimed in claim 1, wherein the first material is Cu.

7. The method as claimed in claim 1, wherein the first intermediate layer is a Cu layer.

8. The method as claimed in claim 1, wherein the average grain diameter H is less than 100 nm.

9. A method of bonding a first substrate to a second substrate coated with a second diffusion bond layer, comprising the steps of:
coating the first substrate with a first diffusion bond layer, the coating comprising:
forming a first intermediate layer on a first surface of the first substrate, the first intermediate layer having an average grain diameter H' parallel to the first surface and an average grain diameter V' transverse to the first surface; and
depositing the first diffusion bond layer on the first intermediate layer, the first diffusion bond layer being formed of a first material and having an average grain diameter H parallel to the first surface and an average grain diameter V transverse to the first surface, the average grain diameter H being less than 1 µm;
contacting the first diffusion bond layer of the first substrate with the second diffusion bond layer of the second substrate; and
pressing the substrates together to form a permanent metal diffusion bond between the first and second substrate,
wherein the average grain diameter H' is greater than the average grain diameter H, and
wherein the average grain diameter V' is greater than the average grain diameter V.

10. The method as claimed in claim 9, wherein the permanent bond has a bond strength of greater than 1.5 J/m$^2$.

11. The method as claimed in claim 9, wherein the pressing together takes place at a pressure between 0.1 and 10 MPa.

12. The method as claimed in claim 9, wherein the first and/or the second diffusion bond layer are configured to allow grain boundary diffusion to occur therethrough.

13. The method as claimed in claim 9, wherein the formation of the permanent bond takes place at a temperature between room temperature and 500° C., and
wherein the formation of the permanent bond occurs within a maximum 12 days.

14. The method as claimed in claim 9, wherein the first material is Cu.

15. The method as claimed in claim 14, wherein the first intermediate layer is a Cu layer.

16. A method of coating a first substrate with a first diffusion bond layer, the method comprising:
forming a first intermediate layer on a first surface of the first substrate, the first intermediate layer having an average grain diameter H' parallel to the first surface and an average grain diameter V' transverse to the first surface;
forming a second intermediate layer on the first intermediate layer, the second intermediate layer having an average grain diameter H" parallel to the first surface and an average grain diameter V" transverse to the first surface; and
depositing the first diffusion bond layer on the second intermediate layer, the first diffusion bond layer being formed of a first material and having an average grain diameter H parallel to the first surface and an average grain diameter V transverse to the first surface, the average grain diameter H being less than 1 µm,
wherein the average grain diameter H' is greater than the average grain diameter H,
wherein the average grain diameter V' is greater than the average grain diameter V, and
wherein H" is less than H' and greater than H, and V" is less than V' and greater than V.

17. The method as claimed in claim 16, wherein the first material is Cu.

18. The method as claimed in claim 17, wherein the first intermediate layer is a Cu layer.

* * * * *